(12) United States Patent
Kurokawa et al.

(10) Patent No.: US 6,573,540 B2
(45) Date of Patent: *Jun. 3, 2003

(54) SEMICONDUCTOR DEVICE AND METHOD FOR FABRICATING THE SAME

(75) Inventors: Atsushi Kurokawa, Higashimurayama (JP); Masao Yamane, Takasaki (JP); Kazuhiro Mochizuki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/026,968

(22) Filed: Dec. 27, 2001

(65) Prior Publication Data

US 2002/0055221 A1 May 9, 2002

Related U.S. Application Data

(63) Continuation of application No. 09/639,754, filed on Aug. 15, 2000, now Pat. No. 6,403,991.

(30) Foreign Application Priority Data

Aug. 19, 1999 (JP) .............................. 11-232378
Jul. 18, 2000 (JP) ........................ 2000-216848

(51) Int. Cl.[7] .............................................. H01L 31/072
(52) U.S. Cl. ....................... 257/197; 438/312; 438/321; 438/343
(58) Field of Search ................................ 257/197, 198; 438/312, 116, 321, 343

(56) References Cited

U.S. PATENT DOCUMENTS

| | | | |
|---|---|---|---|
| 3,886,458 A | 5/1975 | Matsumoto et al. | 325/439 |
| 4,966,860 A | 10/1990 | Suzuki et al. | 437/31 |
| 5,270,223 A | 12/1993 | Liu | 437/31 |
| 5,321,279 A | 6/1994 | Khatibzadeh et al. | |
| 5,859,447 A | 1/1999 | Yang et al. | 257/197 |
| 6,403,991 B1 * | 6/2002 | Kurokawa et al. | 257/197 |

FOREIGN PATENT DOCUMENTS

JP 7-7014 1/1995

* cited by examiner

Primary Examiner—Trung Dang
(74) Attorney, Agent, or Firm—Mattingly, Stanger & Malur, P.C.

(57) ABSTRACT

A bipolar transistor device with a large current capacity is formed by connecting a plurality of transistor elements to each other in parallel, each transistor element having a collector layer, a base layer, and an emitter layer formed respectively in a semiconductor substrate. In the bipolar transistor device, the base layers of a plurality of the transistor elements are extended in parallel to each other and those base layers are separated from each other. In each separated base layer, a first base electrode is formed on a part of the base layer which is separated from an emitter junction with the emitter layer, and a second base electrode is formed on another portion of the base layer closer to the emitter junction than the first base electrode. To dispose the base electrodes of a plurality of the transistor elements in parallel to each other, a base wiring is connected to the first base electrodes of those elements electrically. Consequently, a ballast resistor that causes no variation in the resistance value can be connected to each of a plurality of the transistor elements.

2 Claims, 13 Drawing Sheets

SEMICONDUCTOR DEVICE AND METHOD FOR FABRICATING THE SAME

This application is a continuation of application Ser. No. 09/639,754, filed Aug. 15, 2000, now U.S. Pat. No. 6,403,971.

BACKGROUND OF THE INVENTION

The present invention relates to a semiconductor device, more particularly to an effective technique for fabricating a fast operation semiconductor device with use of a compound semiconductor material.

In recent years, the communication/information processing field has kept demanding a super fast operation semiconductor element strongly so as to cope with a rapid increase of communication demands or amounts of information to be processed. And, in order to meet such demands, there has appeared a hetero-junction bipolar transistor (hereafter, to be referred to as the HBT) that uses a wide band gap semiconductor for its emitter. Because the HBT comes to have such an emitter of a wide band gap, the back injection of carriers from the base to the emitter is low in amount and the injection efficiency for the emitter is high. The HBT can thus have a high current gain. In addition, the high current gain can be kept even at a high base density. As a result, the base resistance can be reduced, thereby enabling the HBT to be provided with a super fast operation having a high current gain driving performance. This is why the HBT has been employed for such mobile communication terminals as portable telephones, etc. for which the power of the high frequency in the microwave area must be amplified effectively.

For the power amplification transistor employed for a transmission amplifier circuit of such a mobile communication terminal, the current is increased more and more so as to increase the transmission output. Generally, the area of each junction of the bipolar transistor is increased in order to achieve this large current. And, to avoid an increase of the chip area caused by such an increase of the junction area, a multiple-finger structure is employed. The multiple-finger structure enables a plurality of emitters, bases, and collectors disposed in parallel like a striped pattern are connected to each other in parallel.

In a bipolar transistor element, the characteristics of the bipolar transistor is changed sometimes, resulting in straying off the specifications of a transistor element from a vicious circle; for example, the characteristics of the bipolar transistor are changed due to a temperature change, etc. during operation, then the current flow is increased due to such a rising of the temperature, and this current increase causes the temperature further to rise, thereby the current flow is changed significantly. To avoid such a problem, there is a well-known method as disclosed in the official gazette of Japanese patent laid-Open No. Hei 7-7014 (corresponding to U.S. Pat. No. 5,321,279). According to this method, a metallic resistor is added serially to an emitter finger or base finger as a ballast impedance. The metallic resistor is made of, for example, such a metallic material having a high specific resistance as tungsten nitride, tantalum nitride, etc. This method increases the voltage drop at both ends of the ballast impedance when the current is increased, thereby the finger current is reduced. The transistor operation can thus be stabilized.

SUMMARY OF THE INVENTION

However, such a method for adding a metallic resistor has a problem that a new process for forming the metallic resistor must be added, thereby increasing the number of processes. The method also has another problem that requires wiring between the formed metallic resistor and an electrode of the bipolar transistor element and forming a contact area for the wiring. And, this causes the element area to be increased and the fabricating cost to be raised.

Under such circumstances, it is an object of the present invention to provide a technique for forming a ballast resistor by solving those conventional problems, suppressing the number of processes, as well as the element area from increasing.

The above and other objects, as well as other features of the present invention will appear more apparently with the description and the accompanying drawings in this specification.

Hereunder, the outline of some of the inventions to be disposed in this specification will be described briefly.

A semiconductor device of the present invention comprises a semiconductor substrate and a plurality of semiconductor elements, each of which has a collector layer, a base layer, and an emitter layer formed in the semiconductor substrate. The base layer and the emitter layer are separated from each other between a plurality of the semiconductor elements. Each of the semiconductor elements includes a first base electrode connected to the base layer respectively and an emitter electrode connected to the emitter layer. The first base electrodes of the semiconductor elements are connected to each other commonly by a common base wiring and the emitter electrodes of the semiconductor elements are connected to each other commonly by a common emitter wiring. The first base electrode of each of the semiconductor elements is connected to the base layer separated from an end of an emitter junction formed by the emitter layer and the base layer.

Furthermore, the semiconductor device of the present invention comprises a semiconductor substrate made of a compound semiconductor material and a plurality of hetero-junction bipolar transistor type semiconductor elements, each of which has a collector layer, a base layer, and an emitter layer formed in the semiconductor substrate. The base layers of the semiconductor elements are formed like a plurality of base fingers in shape, which are extended independently of others. Each base finger layer has an emitter junction with the emitter layer formed on part thereof and a first base electrode formed so as to be separated from the emitter junction. The emitter layer has an emitter electrode connected thereto and respective emitter electrodes are connected to each other in common by a common emitter wiring, while a common base wiring connects the first base electrodes of the semiconductor elements to each other commonly. The first base electrode of each of the semiconductor elements is connected to the base layer separated from an end of an emitter junction between the emitter layer and the base layer.

According to a configuration of the present invention, therefore, the first base electrode can function as a resistor electrode. And, the base layers of plural semiconductor elements (transistor cells) are connected to each other in parallel via this resistor electrode respectively. And, a single resistor can be added to an effective base area or intrinsic base area that forms an emitter junction.

According to another configuration of the present invention, a resistor having a more stable even value is given between the effective base area and the first base electrode, that is, the resistor electrode, so the second base electrode is formed on the base layer adjacent to an emitter junction.

This second base electrode can supply an even base potential to the effective base area (for forming a junction with the emitter layer). Concretely, this second base electrode can supply an even base current to the whole effective base area. This second base electrode should preferably be positioned so as to come in contact with the whole base layer adjacent to the emitter junction, that is, so as to be positioned close to the emitter junction.

According to the present invention described above, the base layer and the emitter layer are separated from each other between a plurality of semiconductor elements (transistor cells), so a single base resistor comes to be connected to each transistor cell, that is, each transistor cell. Consequently, the present invention can limit an object current to each transistor cell stably with use of a base resistor according to such operation characteristics as a current amplification factor of the cell. Consequently, it is possible to improve the heat resistance properties of the whole semiconductor device.

Furthermore, a method of the present invention for fabricating the semiconductor device comprises a process of preparing a semiconductor substrate in which a collector layer, a base layer, and an emitter layer are formed sequentially; a process of coating a first conductive film on the main surface of the emitter layer; a process of patterning the first conductive film so as to form an emitter electrode portion, as well as a dummy electrode portion separated from the emitter electrode portion; a process of removing the emitter layer by using the emitter electrode and the dummy electrode as a mask, thereby exposing a part of the base layer; and a process of forming a second conductive film to be used as a base electrode on a part of the exposed base layer with use of the emitter electrode portion and the dummy electrode portion as a mask.

Another method of the present invention for fabricating the semiconductor device comprises a process of preparing a semiconductor substrate in which a collector layer, a base layer, and an emitter layer are formed sequentially; a process of removing a part of the emitter layer so as to expose a part of the base layer; a process of forming a photo-resist for exposing a part of the base layer on the base layer from which the emitter layer is removed; and a process of forming a second conductive film to be used as a base electrode on the surface of the base layer by using the photo-resist as a mask.

According to the means of the present invention described above, it is possible to extend the base layer so as to make it function as a resistor. Thus, it is also possible to omit a process of forming a wiring for connecting the resistance element to the electrode of each semiconductor element. Consequently, the area of the semiconductor device can be reduced. In addition, it is possible to omit a process for forming such a resistance element as a metallic resistor or the like. Consequently, the fabricating process can be simplified.

Further, the constitution of the semiconductor device can be simplified, yield can be improved, and the cost reduction can be realized.

DESCRIPTION OF THE PREFERRED EMBODIMENTS (Embodiment 1)

Figure 1:
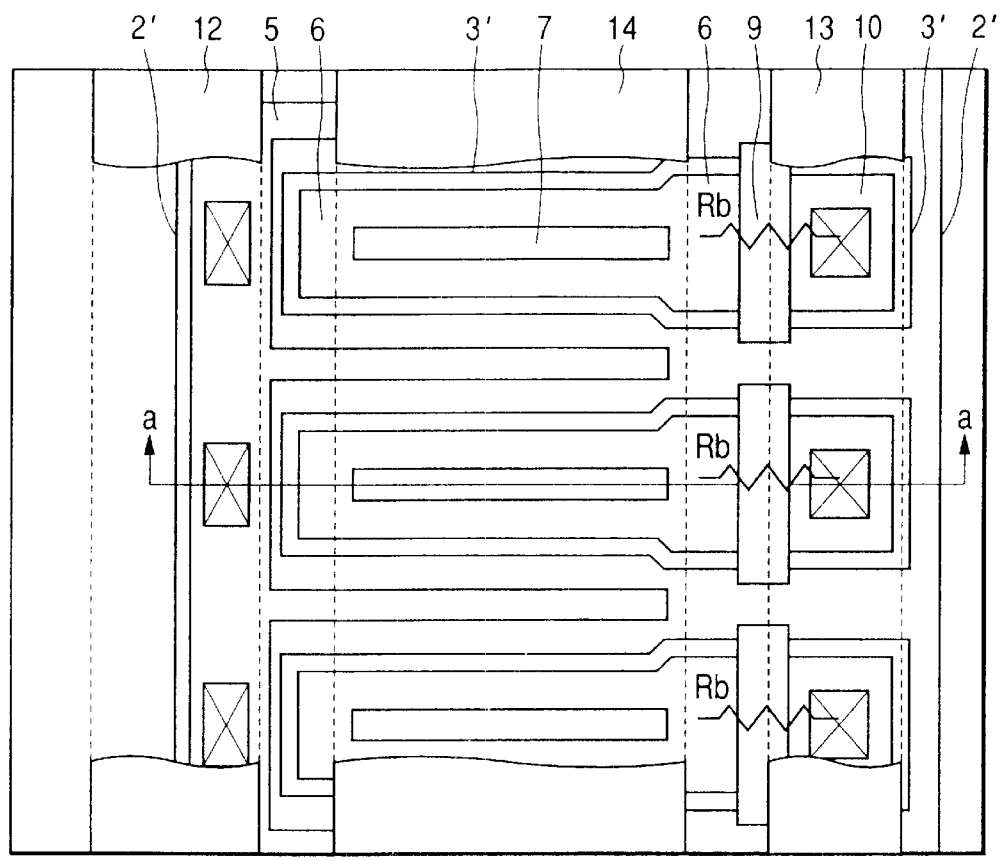
FIG. 1 is a top view of the major portion of a semiconductor device in an embodiment of the present invention.
Figure 2:
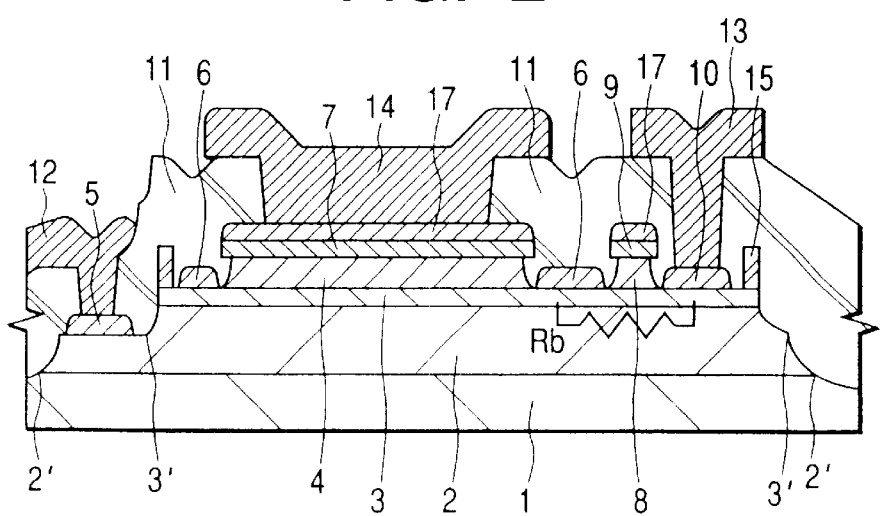
FIG. 2 is a vertical cross sectional view of the semiconductor device taken on line a—a in FIG. 1.
Figure 12:
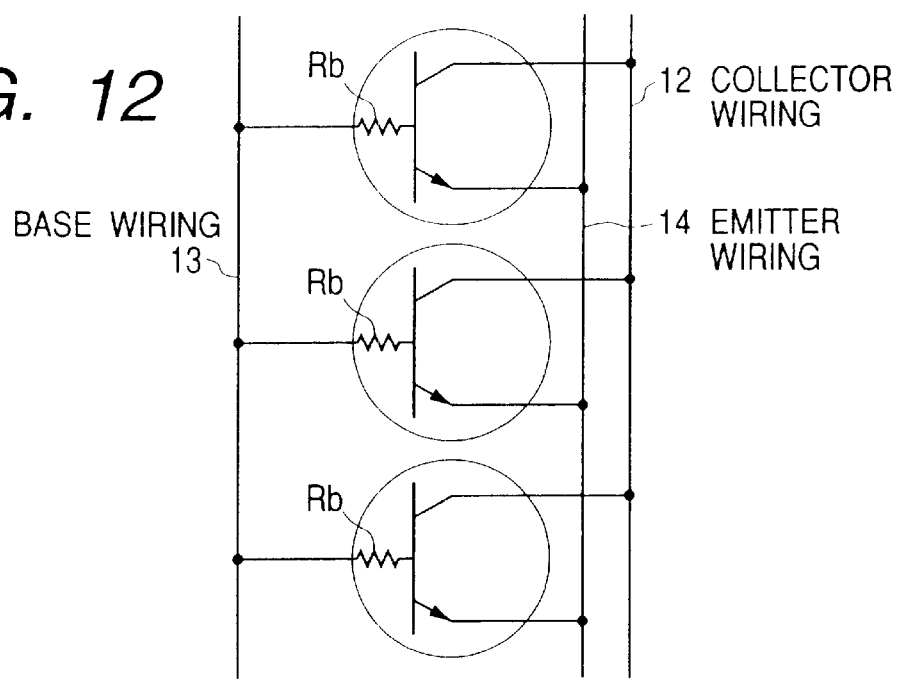
FIG. 12 is a circuit diagram of a configuration of the semiconductor device in the embodiment of the present invention.

FIG. 1 shows a top view of the major portion of a semiconductor device formed in a semiconductor substrate in an embodiment of the present invention. FIG. 2 shows a vertical cross sectional view of the semiconductor device taken on line a—a in FIG. 1. FIG. 12 shows a circuit diagram of a configuration of the semiconductor device shown in FIG. 1. The semiconductor device in this embodiment is a power HBT in which a plurality of unit fingers are usually connected to each other in parallel, so that the semiconductor device can be operated at a large current. As shown in FIG. 12, a base resistor Rb is connected serially to the base of each finger. The base resistor Rb is disposed in each finger area, which is a unit of the HBT.

The semiconductor substrate in the present invention consists of a first epitaxial layer assumed as a collector layer 2 formed on a semiconductor body 1 using half-insulating GaAs; a second epitaxial layer assumed as a base layer 3 formed on the collector layer 2; and a third epitaxial layer assumed as an emitter layer formed on the base layer 3. In addition to such the substrate obtained by forming epitaxial semiconductor layers on its semiconductor body, the semiconductor substrate used in the present invention may also be any of other substrates, for example, a substrate consisting of only a semiconductor body, an SIO substrate obtained by forming a semiconductor layer on the semiconductor body with an insulating film therebetween.

In this embodiment of the present invention, each finger is constituted of a vertical type bipolar transistor including an epitaxial collector layer 2 formed on the semiconductor body made of a half-insulating GaAs; an epitaxial base layer 3 formed on the collector layer 2; and an epitaxial emitter layer 4 formed on each base layer 3. The base layers 3 are separated from each other in a mesa pattern in each finger. The collector layer 2 is separated in a mesa pattern at a boundary with another element if the semiconductor device is not formed as a single element, for example, if it is formed together with other elements on one and the same substrate just like when it is formed as a multiple step amplifier.

The emitter layer 4 comprises a semiconductor layer for taking an ohmic contact easily with the emitter electrode and an n-type InGaP layer functioning as an HBT emitter layer. The base layer comprises p-type GaAs and the collector layer comprises n-type GaAs respectively.

A collector electrode 5, a base electrode 6, and an emitter electrode 7 are connected to the collector layer 2, the base layer 3, and the emitter layer 4 respectively. In this embodiment, there are also formed a dummy layer 8, which is the same layer as that of the emitter layer 4 and a dummy electrode 9, which is the same layer as that of the emitter electrode. And, a resistor electrode 10 is formed by the same layer as that of the base electrode 6, which is formed on the base layer 3. The resistor electrode 10 is spaced from the base electrode 6 by the dummy layer 8 and the dummy electrode 9.

With this configuration, the base layer existing between the ordinary base electrode 6 and the resistor electrode 10 functions as a resistor Rb connected serially to the base if the base wiring is commonly connected to each resistor electrode 10. Concretely, the resistor electrode 10, which is a first base electrode connected to the base layer with a resistor therebetween and a base electrode 6, which is a second base electrode connected directly to the base layer are formed as base electrodes. A base layer 3 between the first and second base electrodes in each finger is formed as a resistor Rb.

The resistor electrode 10, that is, the first base electrode, can be operated as a resistor electrode. And, the base layers 3 of a plurality of semiconductor elements (transistor cells) are connected to each other in parallel. It is thus possible to provide a single resistor to an effective base area (an area where the base layer 3 and the emitter layer 4 are connected to each other) where an emitter junction is formed.

The second base electrode 6 can provide a stable even resistance to between the effective base area and the first base electrode, that is, the resistor electrode 10. This second base electrode 6 functions so as to give an even base potential to the effective base area. In other words, this second base electrode 6 functions so as to supply an even base current to the effective base area. This second base electrode 6, just like in this embodiment, should preferably be in contact with the whole base layer adjacent to the emitter junction, that is, so as to be close to the periphery of the emitter junction.

The resistance value of this resistor Rb is decided by both an impurity density of the base layer 3 and interval between the base electrode 6 and the resistor electrode 10. The impurity density of the base layer 3 is almost decided by the specifications of the transistor. The resistor value can thus be adjusted properly by changing the interval between the base electrode 6 and the resistor electrode 10. In this embodiment, the interval between the base electrode 6 and the resistor electrode 10 is set to about 2 $\mu$m to 4 $\mu$m. And, the base layer 3 formed between the base electrode 6 and the resistor electrode 10, which functions as a resistor Rb, is structured so as not to apply an emitter potential to the dummy electrode 9. Therefore, it does not function as the original base, that is, as an effective base area. Consequently, the width of the base layer 3 can be changed; it is not necessarily kept at the conventional one. In FIG. 1, the width of the base layer 3 is wider than the original one, thereby the resistance value can be adjusted according to this width. In this embodiment, the base layer 3 is p-type GaAs and the sheet resistance is 200 to 300$\Omega$/□. The resistance value can be changed to 300 to 1000$\Omega$ or so by changing both width and length of the base layer assumed as a resistor Rb.

The main surface of the semiconductor substrate having the semiconductor body 1 and the collector electrode 5, the resistor electrode 10, and the emitter electrode 7 formed over the main surface of the semiconductor substrate having the body 1 are all covered with an interlayer insulating film 11 formed with silicon oxide or the like. A collector wiring 12, a base wiring 13, and an emitter wiring 14 (shown with a partially broken line respectively in FIG. 1) are connected to the collector electrode 5, the resistor electrode 10, and the emitter electrode 7 exposed partially through openings formed in the interlayer insulating film 11 respectively.

In the case of the semiconductor device in this embodiment, there is no need to wire, which has been required conventionally for the connection between a resistor body and the electrode of a bipolar transistor element so as to extend the base layer 3 and make it function as a resistor Rb. The area of the semiconductor device can thus be reduced.

Next, a description will be made for each process with respect to how to fabricate this semiconductor device with reference to FIGS. 3 through 8.

Figure 3:
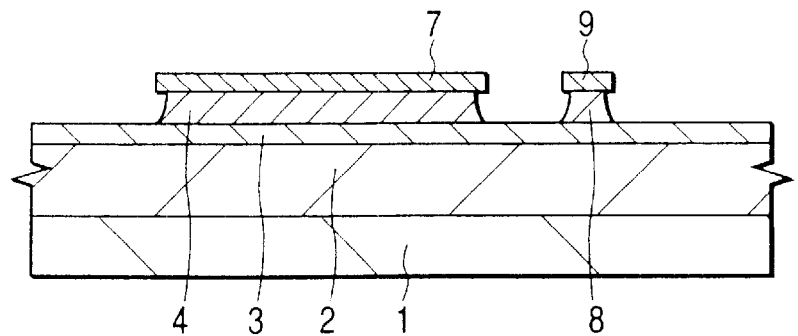
FIG. 3 is a vertical cross sectional view of the semiconductor device in the embodiment of the present invention so as to show the major portion in each process.

At first, epitaxial layers serving as a collector layer 2, a base layer 3, and an emitter layer 4 are grown on the semiconductor body 1 of half-insulating GaAs, etc. by MBE (Molecular Beam Epitaxy) method or the like so as to deposit a Wsi film thereon. After this, the surface is patterned by dry-etching so as to form an emitter electrode 7. A dummy electrode 9 is also formed with this patterning. The emitter electrode 7 and the dummy electrode 9 are used as a mask, thereby etching the emitter layer 4 and the dummy layer 8. This etching is isotropic side etching so as to form the emitter electrode 7 and the dummy electrode 9 as over-hung ones in shape. FIG. 3 shows how the emitter electrode 7 and the dummy electrode 9 are formed as over-hung ones.

Figure 4:
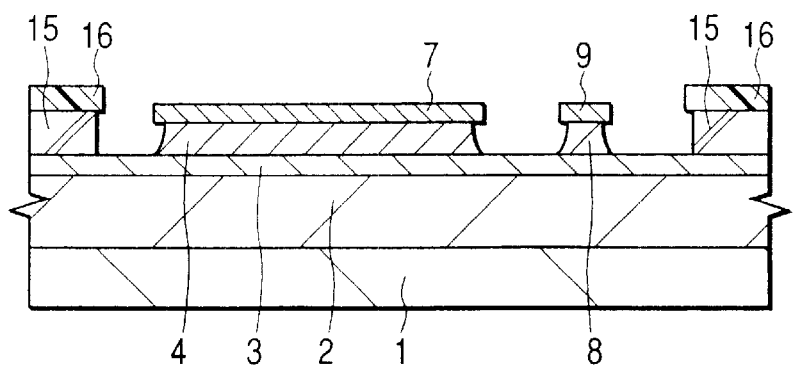
FIG. 4 is a vertical cross sectional view of the semiconductor device in the embodiment of the present invention so as to show the major portion in each process.

Next, an insulating film 15 consisting of, for example, silicon oxide is deposited all over the surface with the CVD method, then the silicon oxide film is removed from the finger-formed area by etching with use of a resist mask 16. FIG. 4 shows the process of such a series of treatments.

Figure 5:
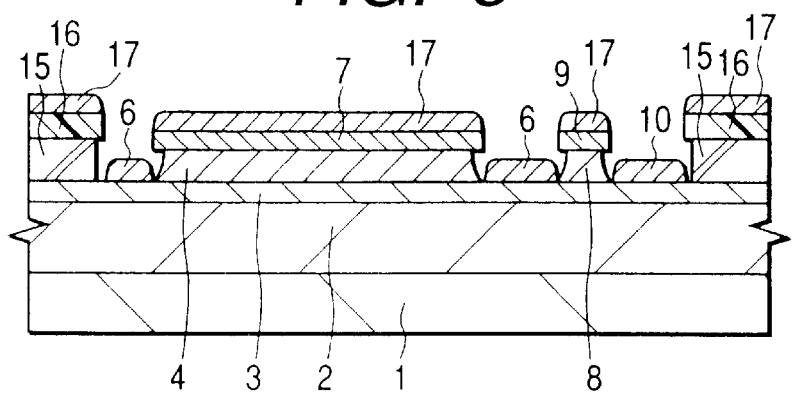
FIG. 5 is a vertical cross sectional view of the semiconductor device in the embodiment of the present invention so as to show the major portion in each process.

Next, a metallic film 17 is coated all over the surface with a vacuum deposition method. The metallic film 17 is a multiple-layer film in which there are deposited, for example, Au, Pt, Ti, Mo, Ti, and Pt in that order (the last Pt is the lowest layer) by a vacuum evaporation method. FIG. 5 shows the process of this treatment.

Figure 6:
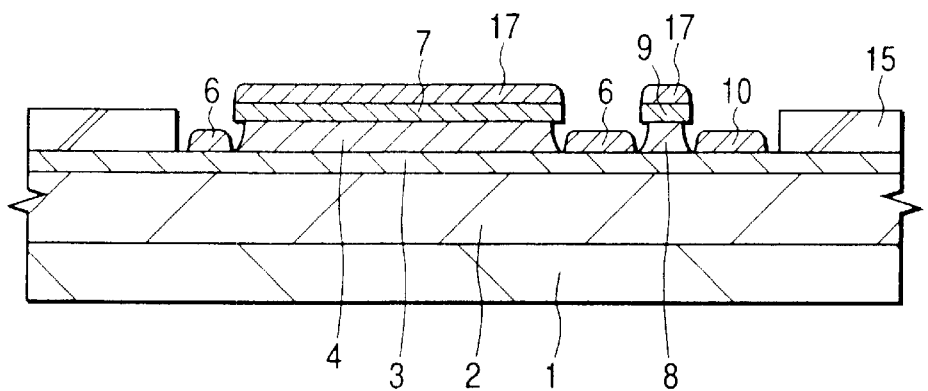
FIG. 6 is a vertical cross sectional view of the semiconductor device in the embodiment of the present invention so as to show the major portion in each process.

Next, the resist mask 16 is removed together with the metallic film 17 formed thereon, then the base electrode 6 is patterned with a so-called lift-off method. With this patterning, the metallic film 17 is formed on both emitter electrode 7 and dummy electrode 9 in each finger area. And, the base electrode 6 and the resistor electrode 10 are formed on the base layer 3 so as to be separated from each other by a dummy electrode 9. Concretely, because both emitter electrode 7 and dummy electrode 9 are used as masks, the base electrode 6 is divided and part of the electrode 6 becomes a resistor electrode 10. Consequently, the base electrode 6 and the resistor electrode have come to be formed with the same material. In addition to a normal connection area adjacent to the dummy electrode 9, the base electrode 6 is formed almost all over the base layer 3 except for the area of the emitter electrode 7. FIG. 6 shows the process of such a series of treatments.

In this case, the patterning by the lift-off method forms both emitter electrode 7 and dummy electrode 9 in the same pattern. And, because the base electrode 6 and the resistor electrode 10 are formed in self-alignment with both emitter electrode 7 and dummy electrode 9, the relative error among the emitter electrode 7, the dummy electrode 9, the base electrode 6, and the resistor electrode 10 is reduced. The base electrode 6 can thus be formed close to an emitter junction and the resistor electrode 10 enables the error of its interval to an emitter junction to be reduced, thereby improving the accuracy of the resistance value of the resistor RB, and furthermore reducing the gap to be generated between the base electrode 6 and the resistor electrode 10.

Figure 7:
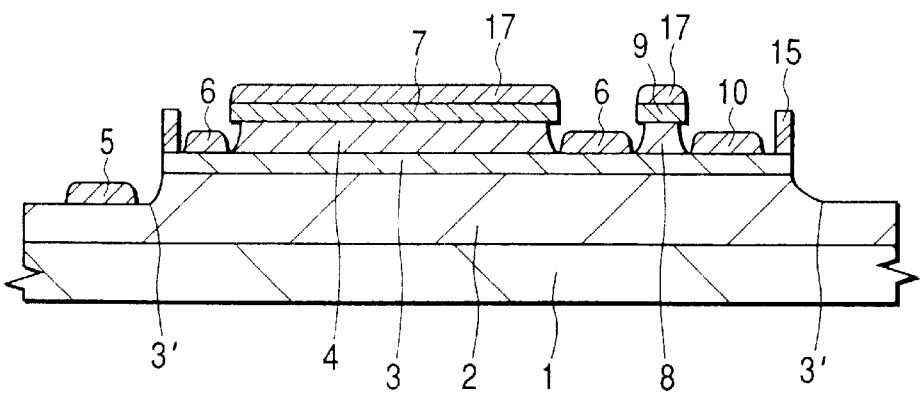
FIG. 7 is a vertical cross sectional view of the semiconductor device in the embodiment of the present invention so as to show the major portion in each process.

Next, the base layer 3 is etched up to the boundary 3' in a mesa pattern, then so-called base mesa etching is done for isolating the base layer 3 in each finger. Collector electrodes 5 are then formed on the collector layer 2 exposed by this etching. FIG. 7 shows the process of such a series of treatments.

Because this etching forms the base layer 3 in a mesa pattern so as to separate each finger from others and forms a collector layer 2 and a collector junction in each finger, the base-collector capacity is reduced. In addition, a single resistor in each finger is connected serially to another so as to be formed integrally with the base layer 3, the current can be controlled by the base resistor stably.

Figure 8:
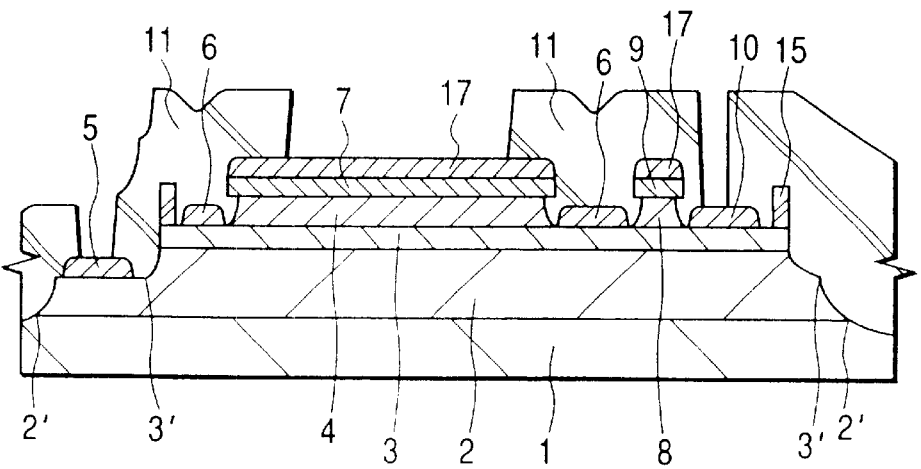
FIG. 8 is a vertical cross sectional view of the semiconductor device in the embodiment of the present invention so as to show the major portion in each process.

Next, the collector layer 2 is etched up to the boundary 2' in a mesa pattern, thereby isolating each of a plurality of fingers from others electrically. This etching forms the etching boundary 2' of the collector layer 2 so as to dig into part of the semiconductor substrate 1 consisting of half-insulating GaAs. After that, an interlayer insulating film 11 consisting of, for example, silicon oxide is deposited with the plasma CVD method, then openings are formed with use of a resist mask formed by photo-lithography. Through the opening are exposed the collector electrode 5, the resistor electrode 10, and the emitter electrode 7 respectively. FIG. 8 shows the process of such a series of treatments.

After that, a metallic film consisting of, for example, AuMo is deposited all over the surface, then a resist mask is formed by photo-lithography. This resist mask is used for patterning to form the collector wiring 12, the base wiring 13, and the emitter wiring 14 as shown in FIG. 2.

Because the semiconductor device in this embodiment extends the base layer 3 so as to make it function as resistors Rb, it is possible to omit a process for forming such resistor bodies as metallic resistors that have been required for forming conventional resistors. It is thus possible to simplify the fabricating process.

(Embodiment 2)

Although the base electrode 6 and the resistor electrode 10 are separated from each other with use of the dummy electrode as a mask in the above embodiment 1, the lift-off method usually requires isotropic etching so as to separate both upper and lower positioned metallic films by side etching. Consequently, if the gap between the base electrode 6 and the resistor electrode 10 is as small as, for example, 1 $\mu$m to 2 $\mu$m, then forming of electrodes might become difficult due to such faults as resist floating, etc. if use of the resist mask is restricted to only once in the conventional lift-off method.

Figure 9:
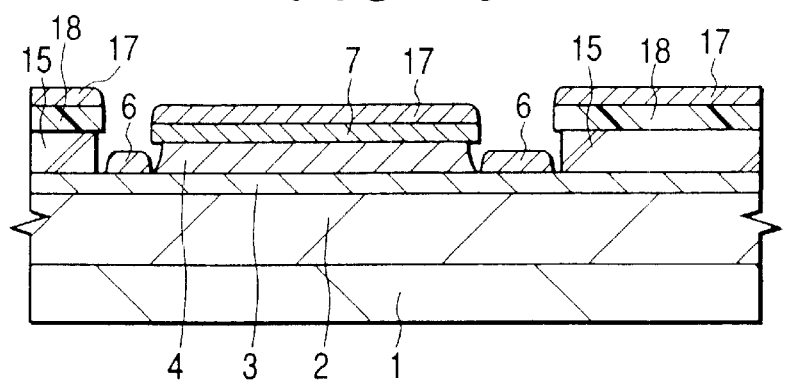
FIG. 9 is a vertical cross sectional view of the semiconductor device in another embodiment of the present invention so as to show the major portion in each process.

The semiconductor device in this embodiment is effective in such a case. The configuration is almost the same as that in the above embodiment 1 except that none of the dummy layer 8 and the dummy electrode 9 is formed. Hereunder, a description will be made for each process for fabricating this semiconductor device with reference to FIGS. 9 through 11.

At first, just like in the embodiment 1 shown in FIG. 3, epitaxial layers are grown on a semiconductor body 1 consisting of half-insulating GaAs. Those epitaxial layers serve as a collector layer 2, a base layer 3, and an emitter layer 4 respectively. Then, a WSi film is deposited on the resultant surface and patterned by dry-etching so as to form an emitter electrode 7. This emitter electrode 7 is used as a mask for etching the emitter layer 4. This etching for the emitter layer 4 is isotropic etching. The emitter layer 4 is then side-etched so as to form the emitter electrode 7 in an over-hung shape. The treatments are the same as those in the embodiment 1 except for that none of the dummy layer 8 and the dummy electrode 9 is formed.

After that, an insulating film 15 consisting of, for example, silicon oxide is deposited all over the surface with the CVD method, then the insulating film 15 is removed from the finger-formed area by etching with use of a resist mask 16 formed by photo-lithography. After that, a metallic film 17 is deposited all over the surface by a vacuum evaporation method. For example, the metallic film 17 is formed by the multiple-layer film deposited by Au, Pt, Ti, Mo, Ti, and Pt in that order (Pt is the lowest layer).

Figure 10:
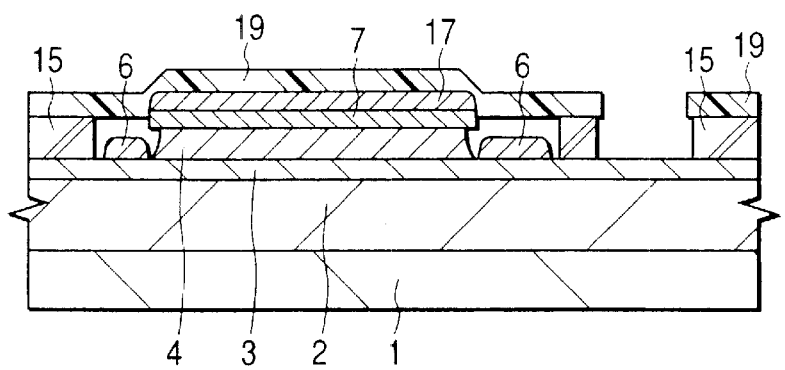
FIG. 10 is a vertical cross sectional view of the semiconductor device in another embodiment of the present invention so as to show the major portion in each process.

Then, the resist mask 18 is removed together with the metallic film 17 formed thereon and patterned so as to form the base electrode 6 with a so-called lift-off method. This patterning forms the metallic film 17 on the emitter electrode 7 in the finger-formed area and forms the base electrode 6 on the base layer 3. In addition to the ordinary connection area, the base electrode 6 is formed almost all over the base layer 3 except for the area of the emitter electrode 7. After that, the insulating film 15 is removed from the resistor electrode-formed area through etching that uses a resist mask 19 formed by photo-lithography. FIG. 10 shows the process of such a series of treatments.

Figure 11:
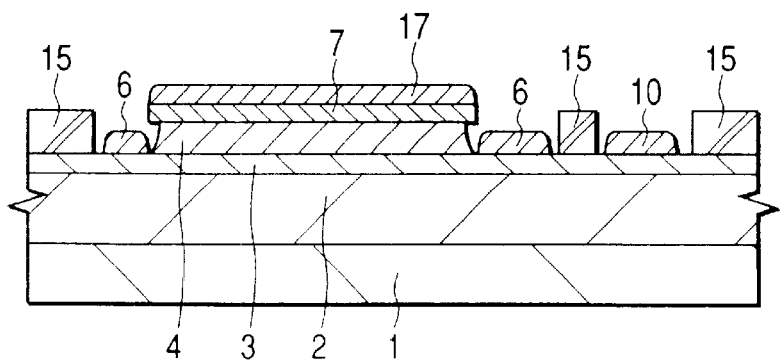
FIG. 11 is a vertical cross sectional view of the semiconductor device in another embodiment of the present invention so as to show the major portion in each process.

Next, a metallic film, which is a multiple-layer film (Pt is the lowest layer), is coated all over the surface with a vacuum deposition method. The metallic film consists of, for example, Au, Pt, Ti, Mo, Ti, and Pt. The resist mask 19 is then removed together with the metallic film formed thereon, then the resistor electrode 10 is patterned with a so-called lift-off method. FIG. 11 shows such a series of processes.

After that, just like the above processes shown in FIGS. 7 and 8, the base layer 3 is etched in a mesa pattern so as to separate each finger from others. The collector electrode 5 is formed on the collector layer 2 exposed by this etching. Then, an interlayer insulating film 11 consisting of, for example, silicon oxide is deposited on the surface with the plasma CVD method and openings are formed so as to expose the connection areas of the collector electrode 5, the resistor electrode 10, and the emitter electrode 7 with use of a resist mask formed by photo-lithography. After that, a metallic film consisting of, for example, AuMo is deposited all over the surface and a resist mask is formed by photo-lithography. This resist mask is then used for patterning so as to form the collector wiring 12, the base wiring 13, and the emitter wiring 14.

The semiconductor device in this embodiment extends the base layer 3 so as to make it function as resistors Rb. It is thus possible to omit a process for forming such resistor bodies as a metallic resistor and the like, although the process is required for forming conventional resistors. The manufacturing process can thus be simplified. In addition, because the insulating film 15 is treated by dry-etching that is highly accurate in treatment, the gap between the base electrode 6 and the resistor electrode 10 can be reduced as small as, for example, 1 $\mu$m to 2 $\mu$m. Consequently, because the resistor Rb can be formed small from the base layer 3, it is possible to reduce the whole area of the semiconductor device, thereby the semiconductor device can be reduced in both size and cost.

(Embodiment 3)

Figure 13:
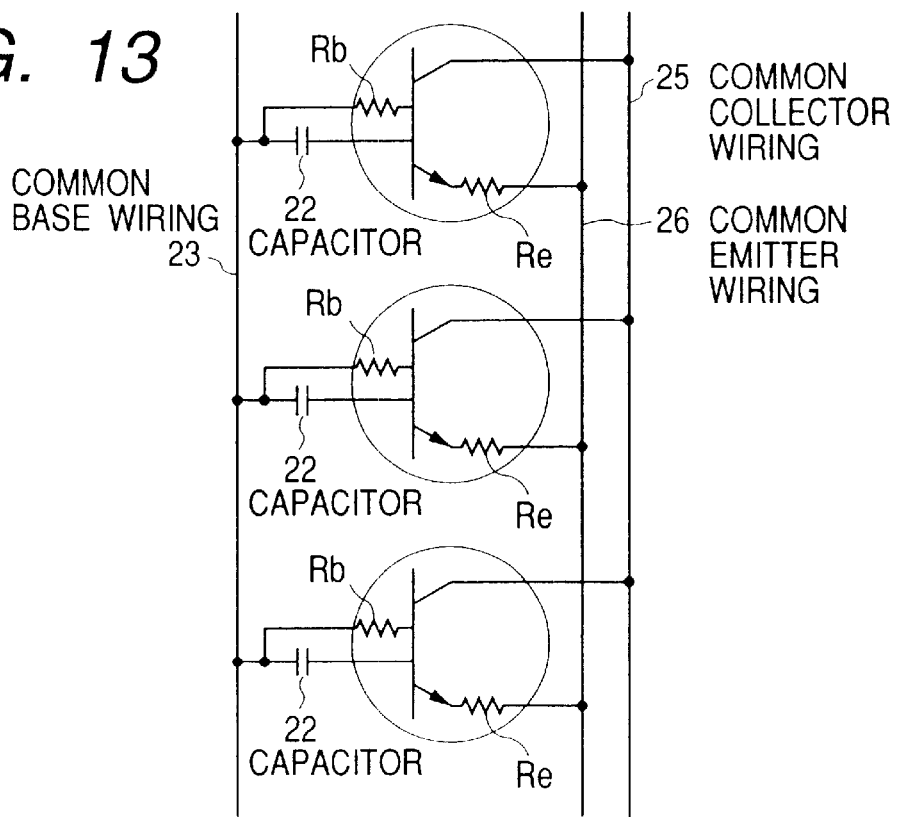
FIG. 13 is a circuit diagram of a configuration of the semiconductor device in another embodiment of the present invention.
Figure 14:
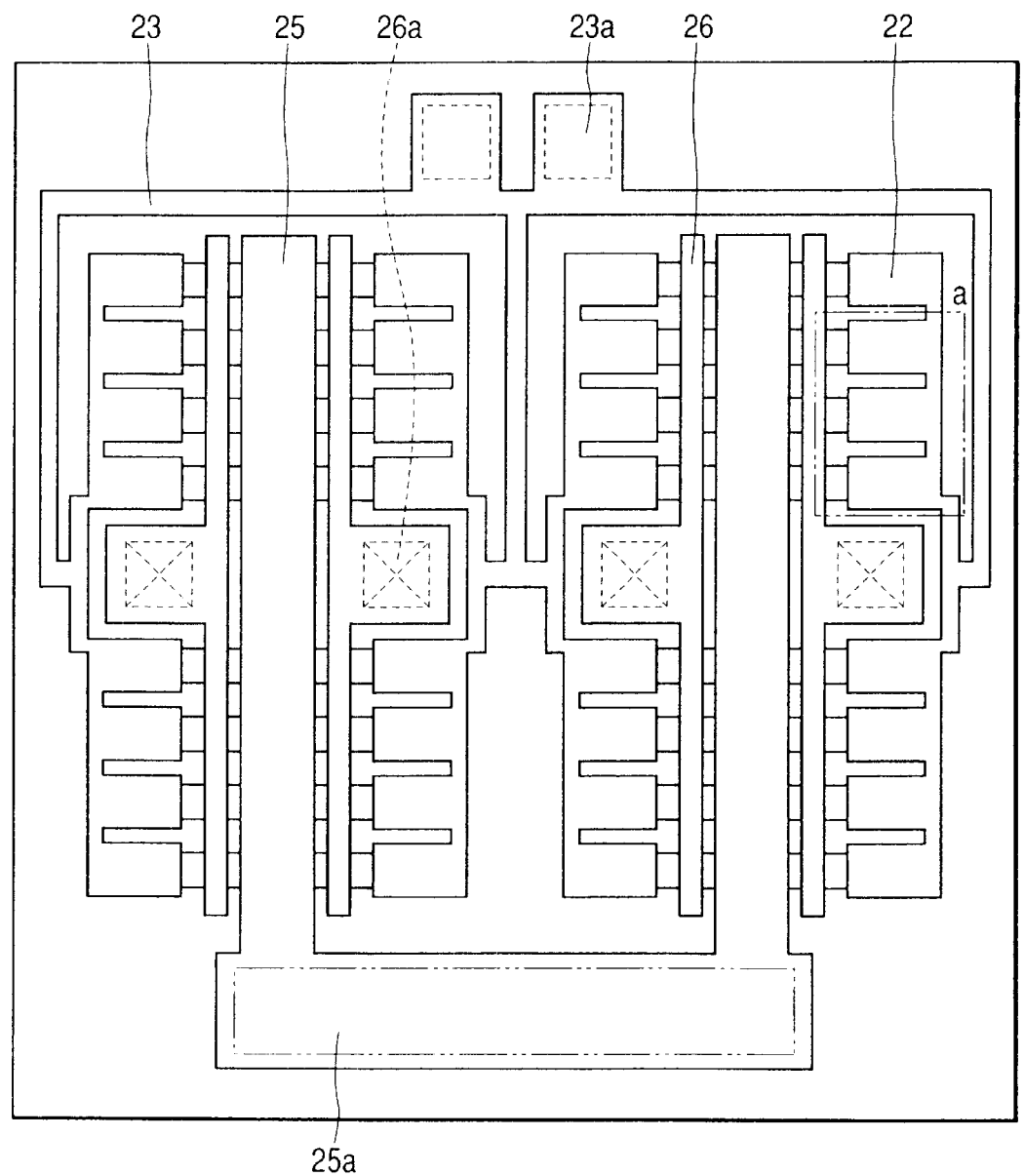
FIG. 14 is an entire top view of the semiconductor device in another embodiment of the present invention.
Figure 15:
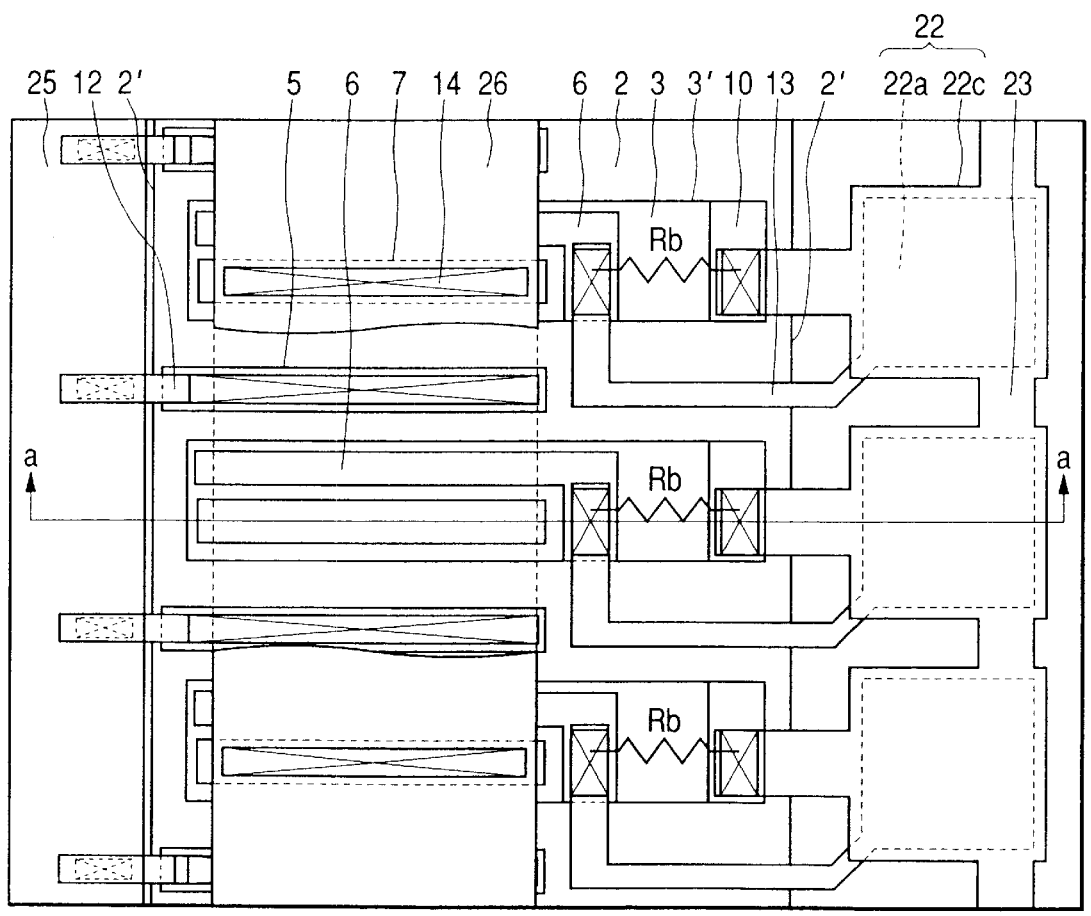
FIG. 15 is a partial top view of the "a" portion of the semiconductor device shown in FIG. 13.
Figure 16:
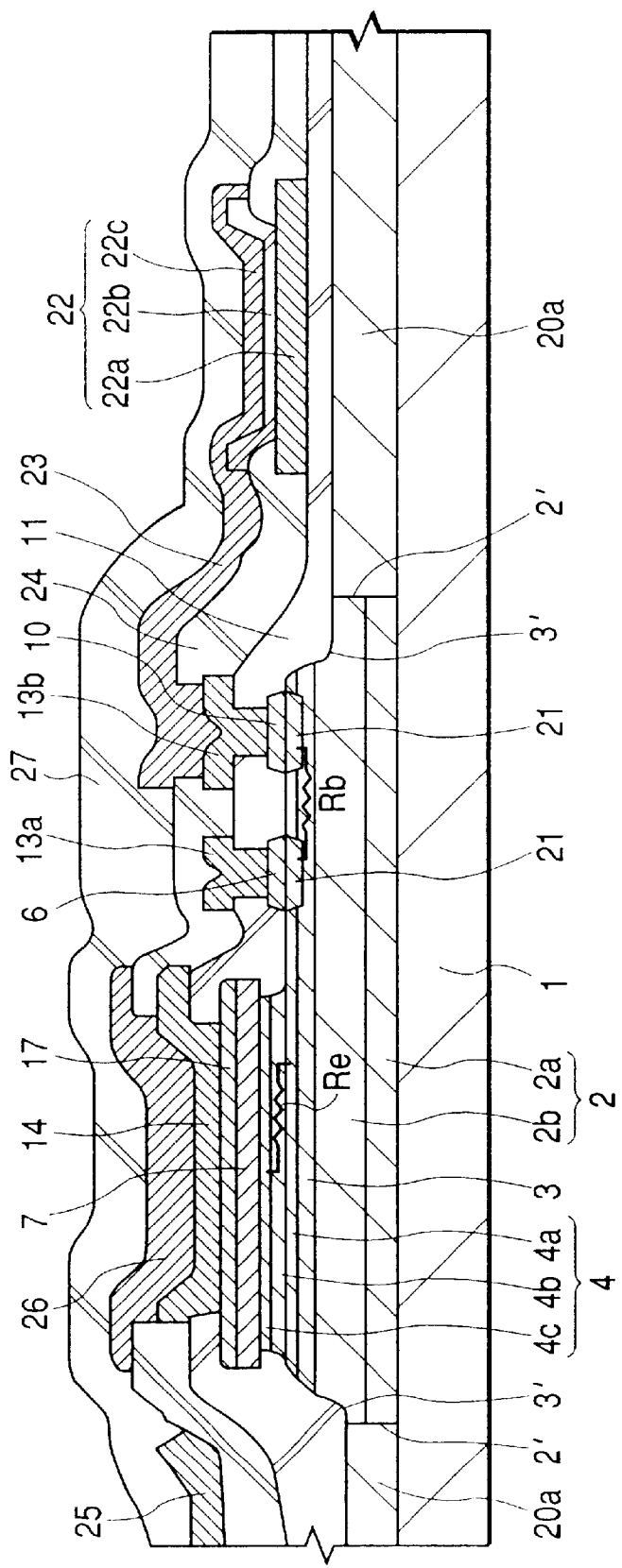
FIG. 16 is a vertical sectional view of the semiconductor device taken on line a—a in FIG. 14.

FIG. 13 shows a circuit diagram of a configuration of the semiconductor device of the present invention in another embodiment. FIG. 14 shows a top view of the semiconductor device in the entire layout. FIG. 15 is an expanded partial top view of the "a" portion of the semiconductor device shown in FIG. 14. FIG. 16 is a vertical cross sectional view of the semiconductor device taken on line a—a in FIG. 15.

The semiconductor device in this embodiment is a power HBT. Usually, it is driven with a large current. Therefore, a plurality of unit fingers are connected to each other in parallel. As shown in FIG. 13, a base resistor Rb is connected serially to each base in each finger and a base capacity is connected serially to each base so as to be in parallel to the base resistors Rb. An emitter resistor Re is also connected serially to each emitter. Both base resistor Rb and emitter resistor Re are provided in each finger, which is a unit of HBT. The base capacity is provided outside the corresponding finger area. The base capacity is used to prevent the RF signal from an input loss due to the addition of the base resistor Rb.

In each unit finger, the collector layer 2 is epitaxial-grown on the semiconductor body 1, the base layer 3 is epitaxial-grown on the collector layer 2 and an emitter layer 4 is epitaxial-grown on each base layer 3 so as to form the object vertically-structured bipolar transistor. The base layer 3 is formed in a mesa pattern so as to be separated in each finger. Such protons as hydrogen, boron, etc. are implanted in the collector layer 2 outside the finger area so as to form a high resistance area 20a. This high resistance area 20a separates each finger from others without employment of the mesa pattern for separation into fingers. The semiconductor substrate mentioned above may be another one, for example, a unitary semiconductor substrate composed of a single semiconductor body, a substrate composed of such a semiconductor layer as an epitaxial layer or the like formed on a semiconductor body, a substrate composed of a semiconductor layer formed on a semiconductor body with an insulating layer therebetween.

The emitter layer 4 consists of an n-type InGaP layer 4a that functions as an emitter layer of the HBT; an emitter resistance layer 4b; and a semiconductor layer 4c for coming into an ohmic contact with the emitter electrode easily. The emitter resistance layer 4b functions as an emitter resistors Re connected serially to the emitter. Impurities of $1E17/cm^3$ or so are implanted into the emitter resistance layer 4b. The base layer 3 consists of p-type GaAs. The collector layer 2 consists of an n-type GaAs sub-collector layer 2a of about $1E18/cm^3$ in impurity density and an n-type GaAs intrinsic collector layer 2b of about $1E16/cm^3$ in impurity density.

The n-type InGaP layer 4a of the emitter layer is extended up to the base electrodes 6 and 10 on the base layer, thereby stabilizing the emitter junction. However, the n-type InGaP layer 4a is high in resistance, so the n-type InGaP layer 4a under both emitter resistor layer 4b and semiconductor layer 4c functions actually as an emitter junction. The n-type InGaP layer 4a extended into another area hardly affects the transistor function.

The collector electrode 5, the first base electrode 10, the second base electrode 6, and the emitter electrode 7 are connected to the collector layer 2, the base layer 3, and the emitter layer 4 respectively. The first and second base electrodes 10 and 6 are formed on the same base layer 3 and the second base electrode 6 is formed close to an emitter junction and the first base electrode 10 is formed separately from the second base electrode 6 and the emitter junction. The base electrodes 6 and 10 are connected to the base layer 3 via an alloy layer 21 formed with a heat-treated Pt layer or the like used for the base electrodes 6 and 10 and a heat-treated n-type InGaP layer 4a or the base layer 3. This configuration enables the base layer 3 between the second base electrode 6 and the first base electrode 10 in each finger to function as a resistor Rb connected serially to the base.

The temperature of each resistor Rb rises according to the HBT heated due to an increase of the collector current. However, because the mobility of the hole of the p-type base semiconductor goes low according to the temperature within a real working temperature range of around 300° K, the resistance value of the resistor Rb rises in accordance with the temperature (the same action is also assumed for the n-type base), thereby suppressing the input current to the base. Consequently, the base layer 3 in each finger is used as a resistor Rb, thereby the temperature follow-up property is improved. The thermal stability of the HBT is thus improved more than that of the resistor formed outside the finger.

The resistance value of this resistor Rb is decided by the density of the base layer 3 and the clearance between the second base electrode 6 and the first base electrode 10. The density of the base layer 3 is decided almost by the specifications of the subject transistor. It is thus possible to obtain a proper resistance value by changing the clearance between the base electrode 6 and the first base electrode 10. In this embodiment, the clearance between the second base electrode 6 and the first base electrode 10 is set to 2 $\mu$m to 4 $\mu$m. And, the base layer 3 between the base electrode 6 functioning as a resistor Rb and the first base electrode 10 is separated from the emitter layer 4, so it does not function as the originally intended base. Consequently, the width of the base layer 3 is varied and the resistance value can be adjusted according to the width of the base layer 3. In this embodiment, the base layer 3 consists of p-type GaAs and its sheet resistor is 200 to 300$\Omega$/□. It is thus possible to obtain a resistance of 30 to 100$\Omega$ if both width and length of the base layer 3 assumed as a resistor Rb are changed.

The main surface of the semiconductor substrate having the semiconductor body 1 as well as the collector electrode 5, the first base electrode 10, and the emitter electrode 7 formed on the main surface of the semiconductor substrate having the body 1 are all covered with an interlayer insulating film 11 consisting of silicon oxide or the like. And, the collector electrode 5, the first base electrode 10, and the emitter electrode 7 exposed partially through openings formed in the interlayer insulating film 11 are connected to the collector wiring 12, the base wiring 13, and the emitter wiring 14 respectively.

The base capacity 22 is provided outside its base finger area and it is structured as an MIM (Metal Insulator Metal) on which the lower electrode 22a on a metallic film, the capacity insulating film 22b consisting of silicon oxide or silicon nitride, and the upper electrode 22c on the metallic film are laminated sequentially. The lower electrode 22a formed under the base capacity 22 is formed unitarily with the base wiring 13a in the same layer and it is connected to the second base electrode 6. The upper electrode 22c formed on the base capacity 22 is formed unitarily with the common base wiring 23 in the same layer and it is connected to the first base electrode 10 via the base wiring which is formed together with the base wiring 13a in the same layer.

Because the lower electrode 22a is in the same layer as that of the base wirings 13a and 13b, the opening of the interlayer insulating film 24 covering the base wirings 13a and 13b becomes the intrinsic portion of the base capacity 22. If this intrinsic portion is formed at a difference in level or the like, the quality of the capacity insulating film 22b is degraded, thereby causing such a problem as degradation of the breakage pressure resistance of the capacity 22. To avoid such a problem and improve the reliability of the capacity 22, therefore, the intrinsic portion should preferably be formed at a flat portion. And, the intrinsic portion should also be formed so as to be separated, for example, more than 3 μm from the mesa pattern boundary 3' of the base layer 3. In this embodiment, the collector layer 2 is separated from there by the high resistance area 20a, the difference in level is reduced and the area of the capacity 22 can be reduced more than those when each collector layer 2 is separated from others in a mesa pattern.

The elements formed in each finger are connected to each other in parallel via the common base wiring 23, the common collector wiring 25, and the common emitter wiring 26 formed on the interlayer insulating film 24. And, the openings formed in the protection insulating film 27 covering the common base wiring 23, the common collector wiring 25, and the common emitter wiring 26 become base pads 23a or collector pads 25a. The emitter pads are formed at the back surface of the semiconductor substrate 1 and the common emitter wiring 26 is connected to the emitter pads via a through-type wiring 26a that passes through the semiconductor substrate 1. Each pad is connected to a terminal for connecting electrically to an object outside the semiconductor substrate 1.

The semiconductor device in this embodiment requires no wiring for connecting a resistor body to an electrode of a bipolar transistor element, although it has been required so as to extend the base layer 3 and make it function as a resistor Rb. It is thus possible to reduce the semiconductor device in area.

The method for fabricating the semiconductor device in this embodiment is the same as that in the first and second embodiments described above. Both first and second base electrodes 10 and 6 can be patterned with use of the lift-off method. It is also possible to form a resist mask and pattern the second and first base electrodes 6 and 10 with use of the resist mask. Those methods are also the same as those employed in the above first and second embodiments.

Figure 17:
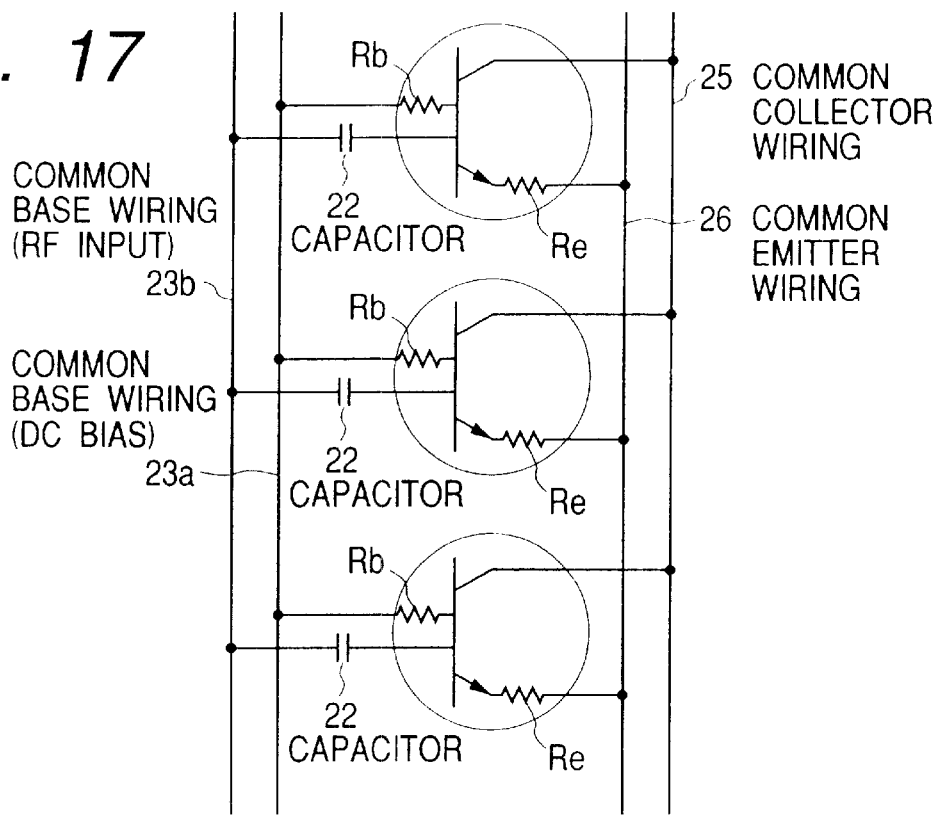
FIG. 17 is a circuit diagram of the semiconductor device in a variation of another embodiment of the present invention.
Figure 18:
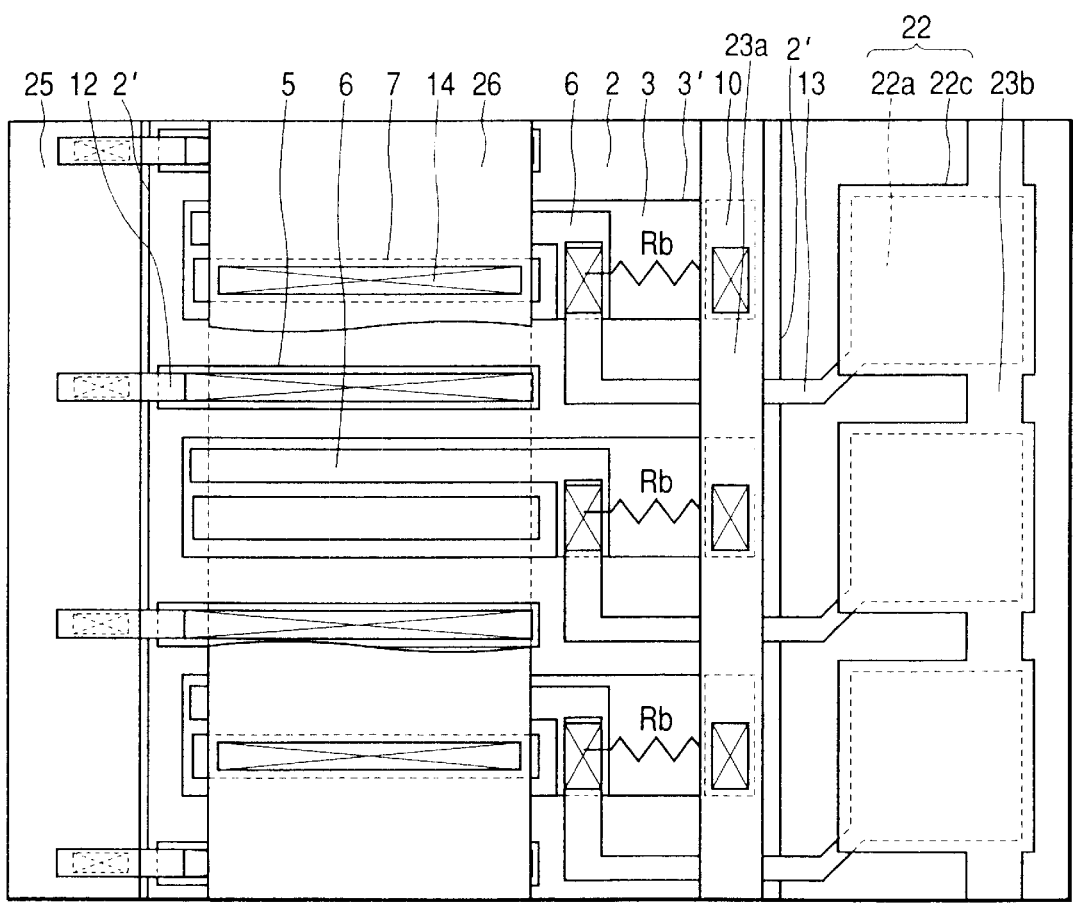
FIG. 18 is a partial top view of the semiconductor device in the variation of another embodiment of the present invention.

FIG. 17 shows an equivalent circuit diagram of a configuration of the semiconductor device, which is a variation of this embodiment. FIG. 18 shows a partial top view of the semiconductor device shown in FIG. 17.

In the semiconductor device in this embodiment, a base resistor Rb is connected to a base in each finger and a base capacity is connected serially to the base and in parallel to the base resistor Rb. An emitter resistor Re is also connected to each emitter serially.

A base resistor Rb and an emitter resistor Re are provided in each finger area, which is a unit of the HBT and a base capacity 22 is provided outside the finger area. The base capacity 22 to which a base resistor Rb is added prevents the RF signal from an input loss. In this embodiment, two common base lines are provided, so that the first base electrode connected to the base via a resistor Rb is connected to the common base wiring 23a for DC biasing and the base capacity 22 connected to the base serially via the second base electrode 6 is connected to the common base wiring 23b for RF input.

Figure 19:
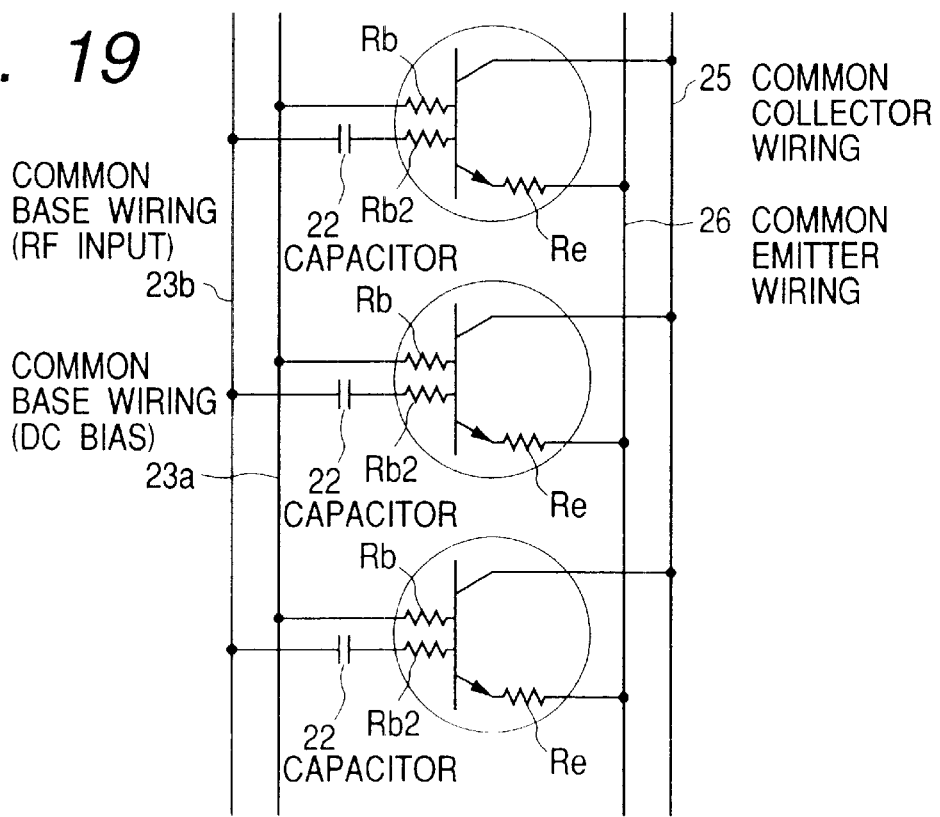
FIG. 19 is a circuit diagram of a configuration of the semiconductor device in a variation of another embodiment of the present invention.
Figure 20:
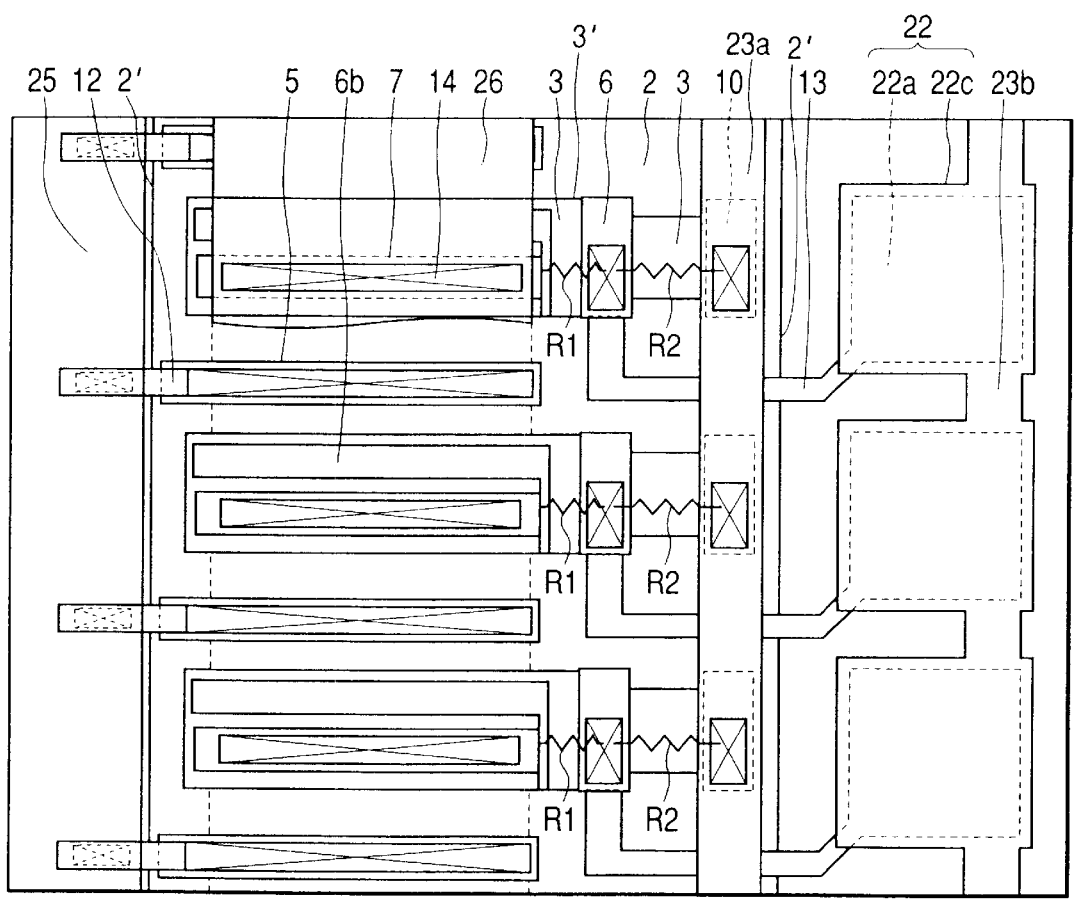
FIG. 20 is a partial top view of the semiconductor device in the variation of another embodiment of the present invention.

FIG. 19 is a circuit diagram of a configuration of the semiconductor device of the present invention, which is another variation of this embodiment. FIG. 20 is a partial top view of the semiconductor device shown in FIG. 20.

In the circuit diagram of the semiconductor device in this embodiment, a base resistor Rb is connected serially to each base in each finger and a base capacity 22 is connected serially to each base via a base resistor Rb2 so as to become in parallel to the base resistor Rb and an emitter resistor Re is connected serially to each emitter as shown in FIG. 19. The semiconductor device is structured as shown in FIG. 20 so that a second base electrode 6 is formed so as to be separated from another 6b formed closer to the emitter junction, thereby a resistor having a resistance value R1 is formed between the base electrode 6b and the base electrode 6. In addition, the resistor having the resistance value R1 is combined with another resistor having a resistance value R2 formed between the first base electrode 10 and the second base electrode 6, thereby setting R1+R2 for the resistance value of the base resistor Rb and R1 for the resistance value of the base resistor Rb2. Both base resistance values Rb and Rb2 can be set to desired values respectively if proper values are set for R1 and R2. The resistance values R1 and R2 are of the resistors formed in the base layer 3.

Base resistors Rb and Rb2, as well as an emitter resistor Re are provided in each finger area, which is a unit of the HBT. A base capacity 22 is provided outside the finger area. The base capacity 22 is added with a base resistor Rb, thereby preventing the RF signal from an input loss. In this embodiment, two common base wirings are provided, so that the first base electrode 10 connected to the base via a resistor Rb is connected to the common base wiring 23a for DC biasing and the base capacity 22 connected to the second base electrode 6 via the resistor Rb2 is connected to the common base wiring 23B for EF input.

Figure 21:
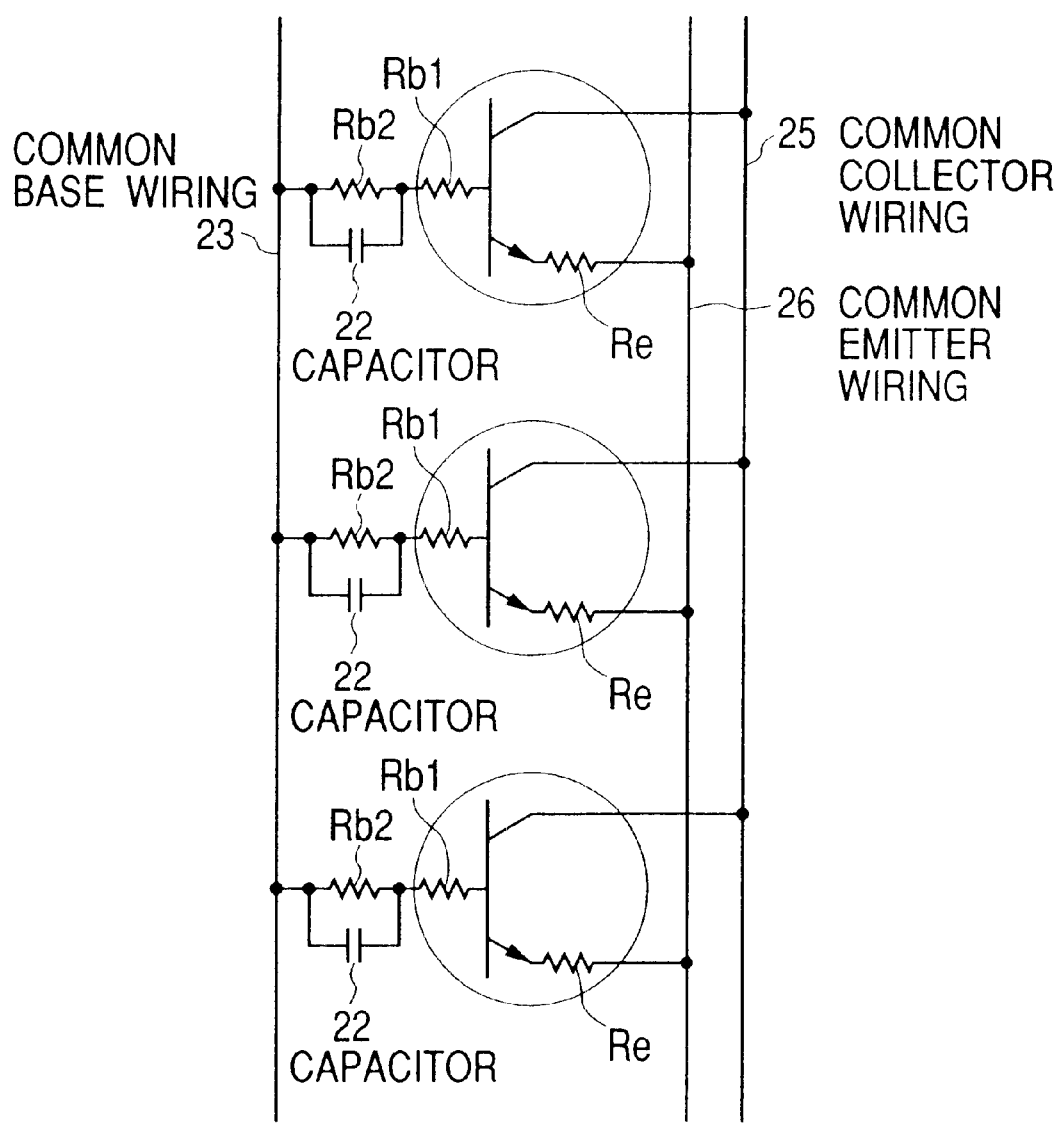
FIG. 21 is a circuit diagram of the semiconductor device in a variation of another embodiment of the present invention.
Figure 22:
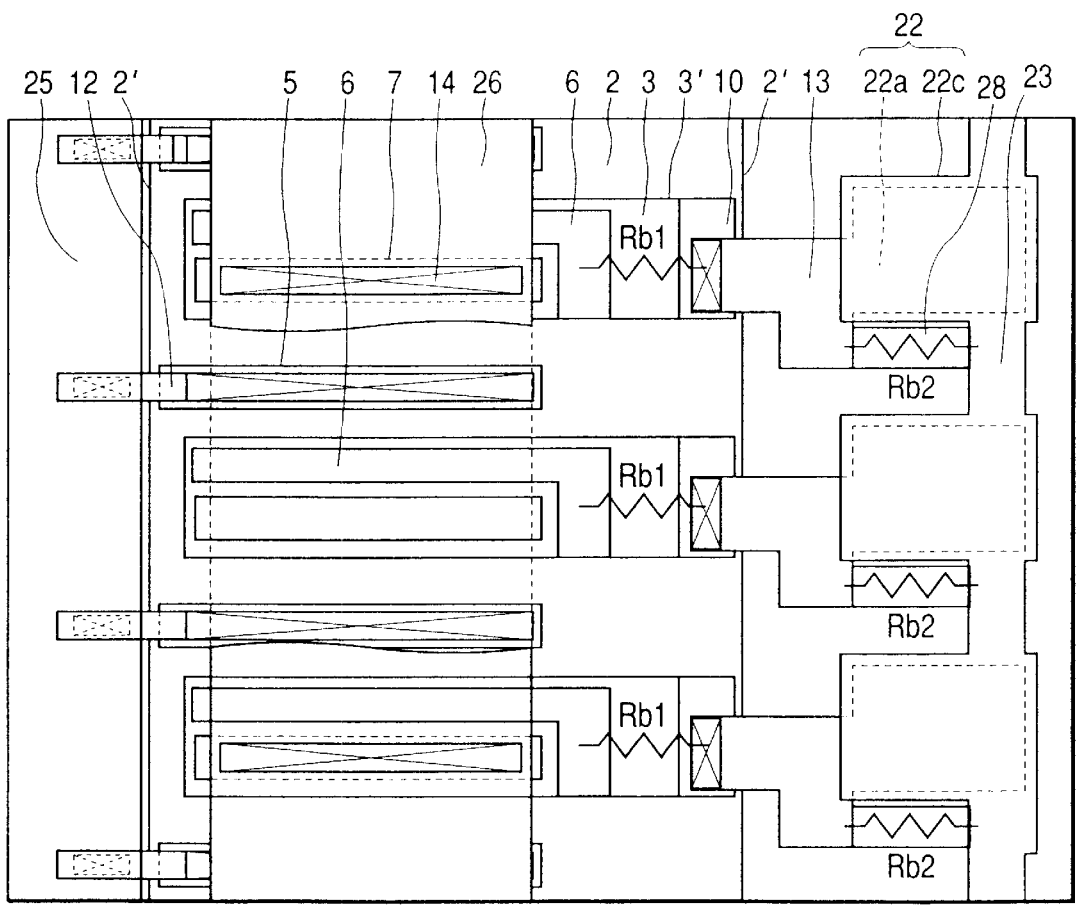
FIG. 22 is a partial top view of the semiconductor device in the variation of another embodiment of the present invention.

FIG. 21 is an equivalent circuit diagram of a configuration of the semiconductor device of the present invention, which is still another variation of this embodiment. FIG. 22 is a partial top view of the semiconductor device shown in FIG. 21.

In the semiconductor device in this embodiment, base resistors Rb1 and Rb2 are connected to each base serially and a base capacity 22 is connected to each base serially via the base resistor Rb1 so as to become in parallel to the base resistor Rb2 in each finger. An emitter resistor Re is also connected serially to each emitter.

Both base resistor Rb1 and emitter resistor Re are provided in each finger area, which is a unit of the HBT. The base resistor Rb2 and the base capacity 22 are provided outside the finger area. In the base capacity 22, the lower electrode 22a is connected to the first electrode 10 via the base wiring 13 and the upper electrode 22c is connected to the common base wiring 23. The base wiring 13 is connected to the common base wiring 23 via a resistance element 28 as a WsiN or the like. This resistance element 28 becomes the base resistor Rb2.

While the preferred embodiments of the present invention have been described, it is also to be understood that modifications will be apparent to those skilled in the art without departing from the spirit of the invention.

Some of the typical effects of the present invention disclosed in this specification will be summarized as follows.

(1) According to the present invention, the base layer can be extended so as to function as resistors.

(2) According to the present invention, it is possible to omit a wiring for connecting a resistance element to an electrode of a semiconductor element due to the above effect (1).

(3) According to the present invention, the area of the semiconductor device can be reduced due to the above effect (2).

(4) According to the present invention, it is possible to omit a process for forming such a resistance element as a metal resistor or the like due to the effect (1), although the process has been needed conventionally.

(5) According to the present invention, the fabricating process can be simplified due to the effect (4).

What is claimed is:

1. A semiconductor device, comprising:

a semiconductor substrate; and a plurality of semiconductor elements, each of which has a collector layer, a base layer, and an emitter layer formed in said semiconductor substrate respectively, said base layer and said emitter layer being separated from each other between a plurality of said semiconductor elements, each of a plurality of said semiconductor elements having a first base electrode connected to said base layer and an emitter electrode connected to said emitter layer;

a common base wiring for connecting said first base electrodes of a plurality of said semiconductor elements to each other commonly; and a common emitter wiring for connecting said emitter electrodes of a plurality of semiconductor elements to each other commonly;

wherein said first base electrode of each of a plurality of said semiconductor elements is connected to said base layer separated from an end of an emitter junction formed by said emitter layer and said base layer;

wherein said base layer between the end of said emitter junction and said first base electrode functions as a base resistor.

2. A semiconductor device, comprising:

a semiconductor substrate made of a compound semiconductor material;

a plurality of hetero-junction bipolar transistor type semiconductor elements, each of which having a collector layer, a base layer, and an emitter layer formed in said semiconductor substrate respectively, said base layers of a plurality of said semiconductor elements being formed like a plurality of base fingers extended independently of each other, each of said base finger layers forming an emitter junction with said emitter layer formed on part of itself and having a first base electrode formed separately from said emitter junction, and said emitter layer having an emitter electrode connected thereto;

a common base wiring for connecting said first base electrodes of a plurality of said semiconductor elements commonly to each other electrically; and a common emitter wiring for connecting emitter electrodes of a plurality of said semiconductor elements commonly to each other electrically;

wherein said base finger layer between said first and second base electrodes functions as a base resistor.

* * * * *